(12) United States Patent
He

(10) Patent No.: US 12,451,475 B2
(45) Date of Patent: Oct. 21, 2025

(54) METHOD FOR DISPLAY MANUFACTURING USING GROUPS OF MICRO-LEDS AND MICRO-LED ARRAYS

(71) Applicant: Google LLC, Mountain View, CA (US)

(72) Inventor: Gang He, Cupertino, CA (US)

(73) Assignee: Google LLC, Mountain View, CA (US)

( * ) Notice: Subject to any disclaimer, the term of this patent is extended or adjusted under 35 U.S.C. 154(b) by 509 days.

(21) Appl. No.: 17/695,563

(22) Filed: Mar. 15, 2022

(65) Prior Publication Data
US 2022/0302101 A1   Sep. 22, 2022

Related U.S. Application Data

(60) Provisional application No. 63/161,859, filed on Mar. 16, 2021.

(51) Int. Cl.
H01L 25/065 (2023.01)
H01L 25/00 (2006.01)
H01L 25/18 (2023.01)

(52) U.S. Cl.
CPC .......... *H01L 25/50* (2013.01); *H01L 25/0652* (2013.01); *H01L 25/0655* (2013.01); *H01L 25/18* (2013.01)

(58) Field of Classification Search
CPC ..... H01L 25/50; H01L 25/0655; H01L 25/18; H01L 25/0652; H01L 33/62; H01L 7/15; H01L 27/153; H01L 25/0753
See application file for complete search history.

(56) References Cited

U.S. PATENT DOCUMENTS

| 10,923,023 B1 | 2/2021 | Bibl et al. |
| 2016/0165734 A1 | 6/2016 | Khalid et al. |
| 2018/0211945 A1 | 7/2018 | Cok et al. |
| 2018/0219142 A1 | 8/2018 | Chen et al. |
| 2018/0269266 A1 | 9/2018 | Cancel Olmo et al. |
| 2019/0319165 A1 | 10/2019 | Zou |

(Continued)

FOREIGN PATENT DOCUMENTS

| KR | 20170116631 A | 10/2017 |
| KR | 20190127666 A | 11/2019 |

(Continued)

OTHER PUBLICATIONS

International Preliminary Report on Patentability for PCT Application No. PCT/US2022/020387, mailed on Sep. 28, 2023, 7 pages.

(Continued)

*Primary Examiner* — Thanh Y. Tran
(74) *Attorney, Agent, or Firm* — Brake Hughes Bellermann LLP

(57) ABSTRACT

A method for transferring one or more clusters of micro-LEDs to a display panel includes fabricating or loading a plurality of micro-LED clusters comprising two or more micro-LEDs onto a substrate, and positioning the substrate in a first position. At least a first micro-LED cluster is aligned with at least a first electrical connector on a display panel. The method also includes lowering the substrate toward the display panel such that the first micro-LED cluster contacts the first electrical connector, and releasing the first micro-LED cluster from the substrate.

17 Claims, 7 Drawing Sheets

(56) References Cited

U.S. PATENT DOCUMENTS

2020/0373350 A1*  11/2020  Kajiyama .......... H10H 20/8513
2021/0036198 A1*   2/2021  Nakabayashi ........ H01L 27/156
2022/0045039 A1*   2/2022  Tsukamoto ............. H01L 24/81

FOREIGN PATENT DOCUMENTS

| KR | 20200074591 A | 6/2020 |
| KR | 20210015033 A | 2/2021 |
| TW | 201733106 A | 9/2017 |
| TW | 201806191 A | 2/2018 |
| WO | 2020146108 A1 | 7/2020 |

OTHER PUBLICATIONS

Office Action for Korean Application No. 10-2023-7029183 (with English translation), mailed Jan. 14, 2025, 12 pages.
Extended European Search Report for European Application No. 22772061.2, mailed Mar. 3, 2025, 9 pages.
Office Action for Taiwanese Application No. 111109606 (with English translation), mailed Jun. 17, 2025, 32 pages.

* cited by examiner

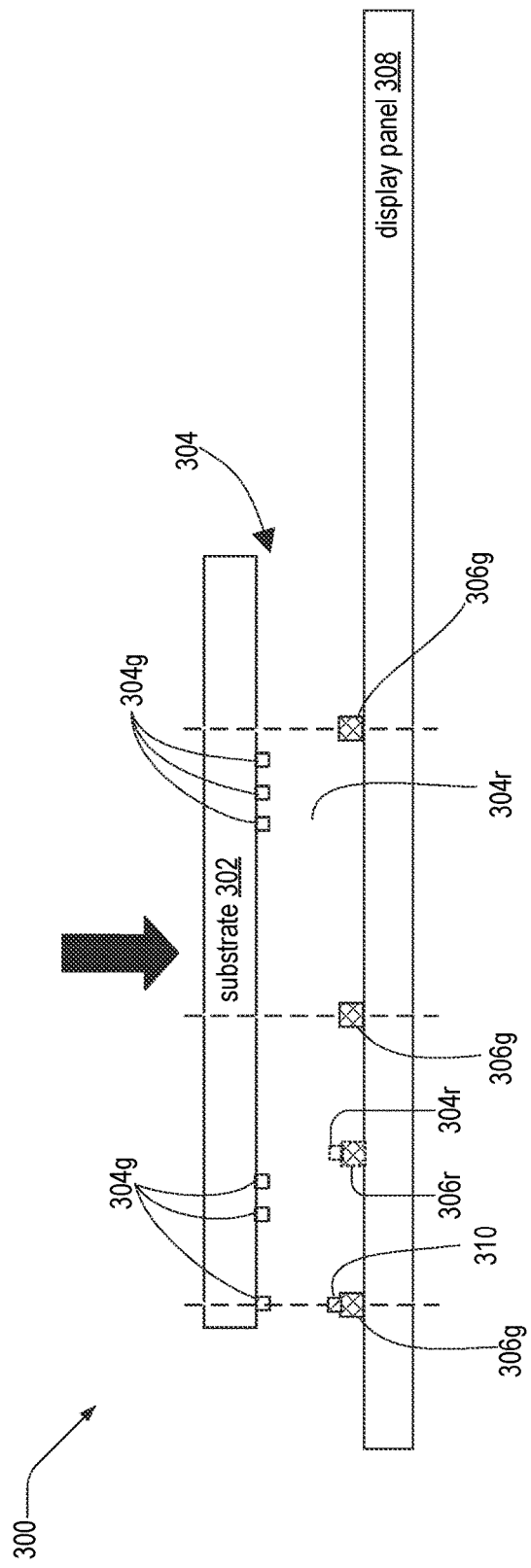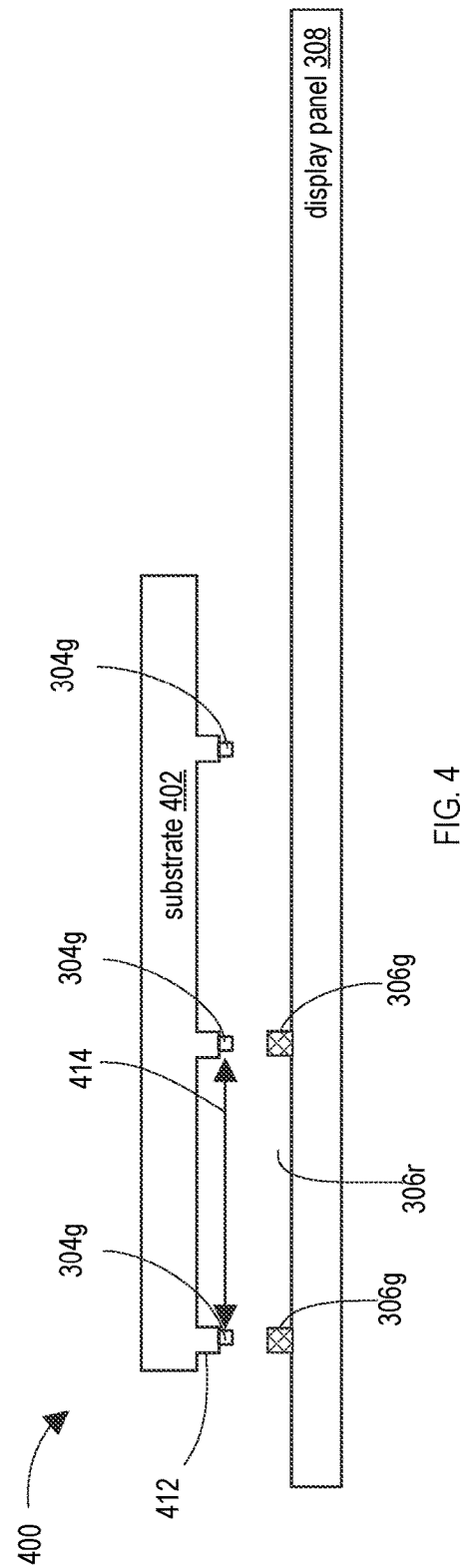

METHOD FOR DISPLAY MANUFACTURING USING GROUPS OF MICRO-LEDS AND MICRO-LED ARRAYS

CROSS-REFERENCE TO RELATED APPLICATIONS

This application benefits from and claims priority to U.S. provisional patent application Ser. No. 63/161,859, filed Mar. 16, 2021, which is incorporated by reference in its entirety.

TECHNICAL FIELD

Aspects of the present disclosure generally relate to light emitting structures, such as the structures of light emitting elements used in various types of displays and other devices and manufacturing methods of light emitting structures.

BACKGROUND

The number of light emitting elements (e.g., pixels) in displays continues to increase to provide better user experiences and to enable new applications. However, increasing the number of light emitting elements is challenging from both a design perspective and a manufacturing perspective. Reducing the size of light emitting elements enables an increased density of such light emitting elements in a device. However, effective and efficient techniques for making smaller light emitting elements in large numbers and high densities are not widely available. For example, it is challenging to manufacture smaller light emitting diodes (LEDs) and incorporate such LEDs into increasingly sophisticated display architectures with stringent requirements for performance and size. Additionally, improvements are needed in light emitting characteristics of light emitting elements for display applications.

Micro-LED display technology requires high-throughput pixel transfer techniques. Typically, the micro-LEDs representing the three primary colors of red, green, and blue are transferred sequentially to the display substrate. The micro-LEDs must be interleaved to provide a full color display. Problems associated with this scheme include low throughput, complex fabrication processes, defects, alignment error, "pick and place" reliability, interference issues, high cost, poor display quality, and the like. There is a need to realize improved fabrication methods for LED-based displays.

SUMMARY OF THE DISCLOSURE

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its purpose is to present some concepts of one or more aspects in a simplified form as a prelude to the more detailed description that is presented later.

Methods of transferring one or more clusters of micro-LEDs to a display panel are disclosed herein. In some embodiments, the methods may comprise fabricating or loading a plurality of micro-LED clusters comprising two or more micro-LEDs onto a substrate, positioning the substrate in a first position, wherein at least a first micro-LED cluster is aligned with at least a first electrical connector on a display panel, lowering the substrate toward the display panel such that the first micro-LED cluster contacts the first electrical connector, and releasing the first micro-LED cluster from the substrate.

Micro-LED clusters having an integrated driving circuit are also disclosed herein. The micro-LED clusters may comprise a plurality of micro-LEDs. The integrated driving circuit may comprise electrical interconnects configured to electrically couple with one or more of or the plurality of micro-LEDs.

BRIEF DESCRIPTION OF THE DRAWINGS

The appended drawings illustrate only some implementation and are therefore not to be considered limiting of scope.

FIG. 3 illustrates physical interference that can occur in an LED transfer process, in accordance with some embodiments.

FIG. 4 illustrates a side view of a pick and place LED transfer system, in accordance with some embodiments.

DETAILED DESCRIPTION

Figure 1A:
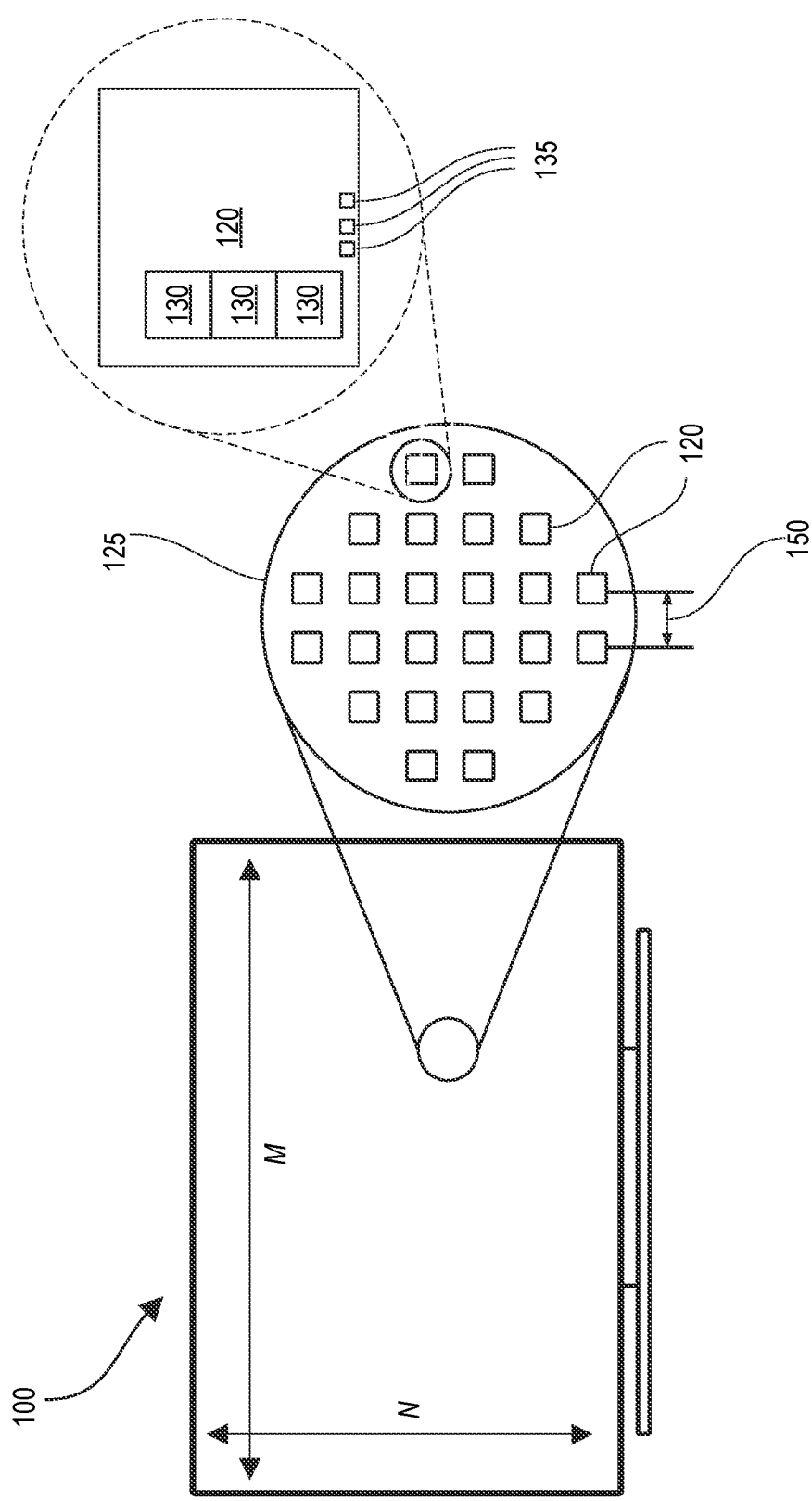
FIG. 1A illustrates a front view of a display system, as well as two detailed views of the display system, in accordance with some embodiments.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as "between" two layers, it can be the only layer between the two layers, or one or more intervening layers may also be present.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "compromising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present. Likewise, when light is received or provided "from" one element, it can be received or provided directly from that element or from an intervening element. On the other hand, when light is received or provided "directly from" one element, there are no intervening elements present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Products that incorporate micro-LED displays offer many advantages over similar products that use traditional LED displays. For example, micro-LEDs (also referred to as mLEDs or μLEDs) generally provide higher-resolution, lower energy-consumption displays than traditional displays and these factors can be central to a consumer's decision to purchase a particular product. As more products seek to satisfy consumer demand and incorporate micro-LED displays, new fabrication methods are needed to bridge the difference in micro-LED density on LED wafers to allow cost-effective displays using micro-LEDs. Many multi-pass transfer processes have been developed to transfer red, green, and blue sub-pixels in separate, overlapping steps. In order to produce full color pixels, the red, green, and blue subpixels must be interleaved which limits the density of emitters and can lead to interference issues between separate transfer steps. Such interferences and previously known methods of addressing them lead to complex fabrication processes that can be slow and risk defects or other inaccuracies that may reduce display quality.

FIG. 1A illustrates a display system comprising a display 100 that receives content data (e.g., data associated with an image, video, or both) from a source (not shown). Referring to the detailed view of display 100 shown in the right-most circle, a plurality of light emitting elements 135, such as micro-LEDs, are arranged into clusters 130 (also referred to herein as "sub-raxels") that are further arranged into an array (i.e. cluster) 120 (also referred to herein as a "raxel"). In some embodiments, sub-raxels 130 may comprise at least one of each color micro-LED 135 that is used within the display 100. For example, each sub-raxel 130 may comprise one or more of a red, green, and/or blue micro-LED 135. While the sub-raxels 130 shown in FIG. 1 are illustrated having a 3×3 array of micro-LEDs 135, three of each being red, green, and blue color emitters, other sizes, aspect ratios, and compositions of micro-LED colors are possible without departing from the scope of the present disclosure.

Referring to the detailed view of display 100 shown in the left circle, a plurality of raxels 120 is arranged into a raxel array (i.e. cluster) 125. Within the raxel array 125, each raxel may be spaced apart by a pitch 150. The pitch 150 may be constant across one or more dimensions of the array 125 or can vary across one or more dimensions of the raxel array 125. Additionally, while raxels 120 are shown in a grid arrangement, other configurations are possible. For example, one or more row or column may be offset or shifted with respect to one or more adjacent row or column.

The raxel array 125 shown in FIG. 1A is rectangular and has a size and aspect ratio represented as M×N over the display 100. Many sizes, shapes, and aspect ratios of a display may be selected as a matter of design choice without departing from the scope of the present disclosure.

Figure 1C:
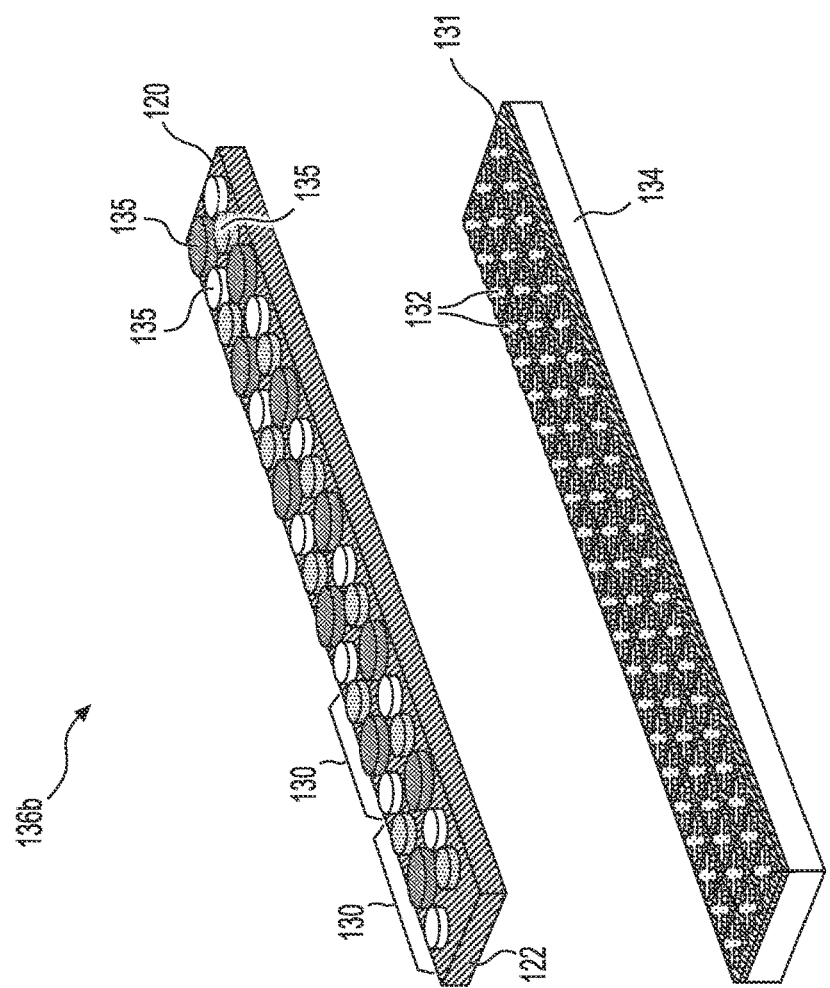
FIG. 1C illustrates an exploded view of a chiplet assembly, in accordance with some embodiments.
Figure 1B:
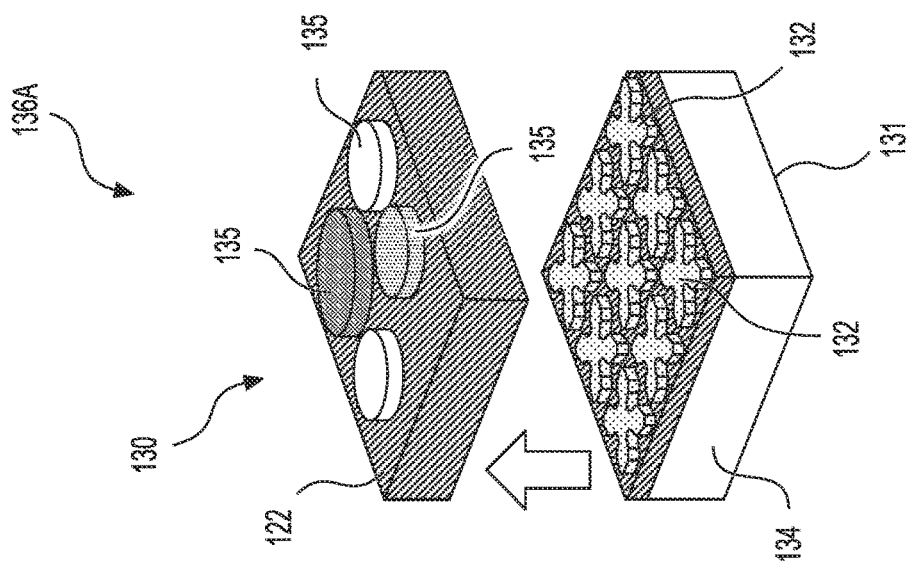
FIG. 1B illustrates an exploded view of a chiplet assembly, in accordance with some embodiments.

Referring to FIGS. 1B and 1C, micro-LEDs 135 of each sub-raxel 130 may be monolithically integrated such that all micro-LEDs in the sub-raxel are formed on a single substrate 122. As shown in FIG. 1B, a sub-raxel 130 may be electrically coupled with an integrated driving circuit, such as a micro integrated circuit ("microIC") 131, to form a "chiplet" 136a. Alternatively, as shown in FIG. 1C, a raxel 120 including a plurality of sub-raxels may be electrically coupled with a microIC 131 to form a chiplet 136b. Each microIC 131 may comprise electrical interconnects 132 that can be used to drive the micro-LEDs 135 within the raxels or sub-raxels that are electrically coupled therewith. The interconnects 132 are supported by a backplane substrate 134. In some embodiments, the microIC may be a separate component that is bonded to the raxel or sub-raxel. Alternatively, the microIC 131 may be formed with the raxel or sub-raxel such that the raxel or sub-raxel and the microIC are monolithically integrated.

Methods for transferring raxels and sub-raxels to a display panel are described herein below with respect to FIGS. 7 and 8. Chiplets 136*a*, 136*b* may be transferred using the same or a similar method. Display panels receiving chiplets (i.e., raxels or sub-raxels together with a microIC) may require fewer and/or simplified electrical circuits and may benefit from reduced density of electrical contact between the sub-raxel and the display panel. In some embodiments, the display panel may be a passive display panel that does not have any active micro-LED drivers thereon.

Figure 2:
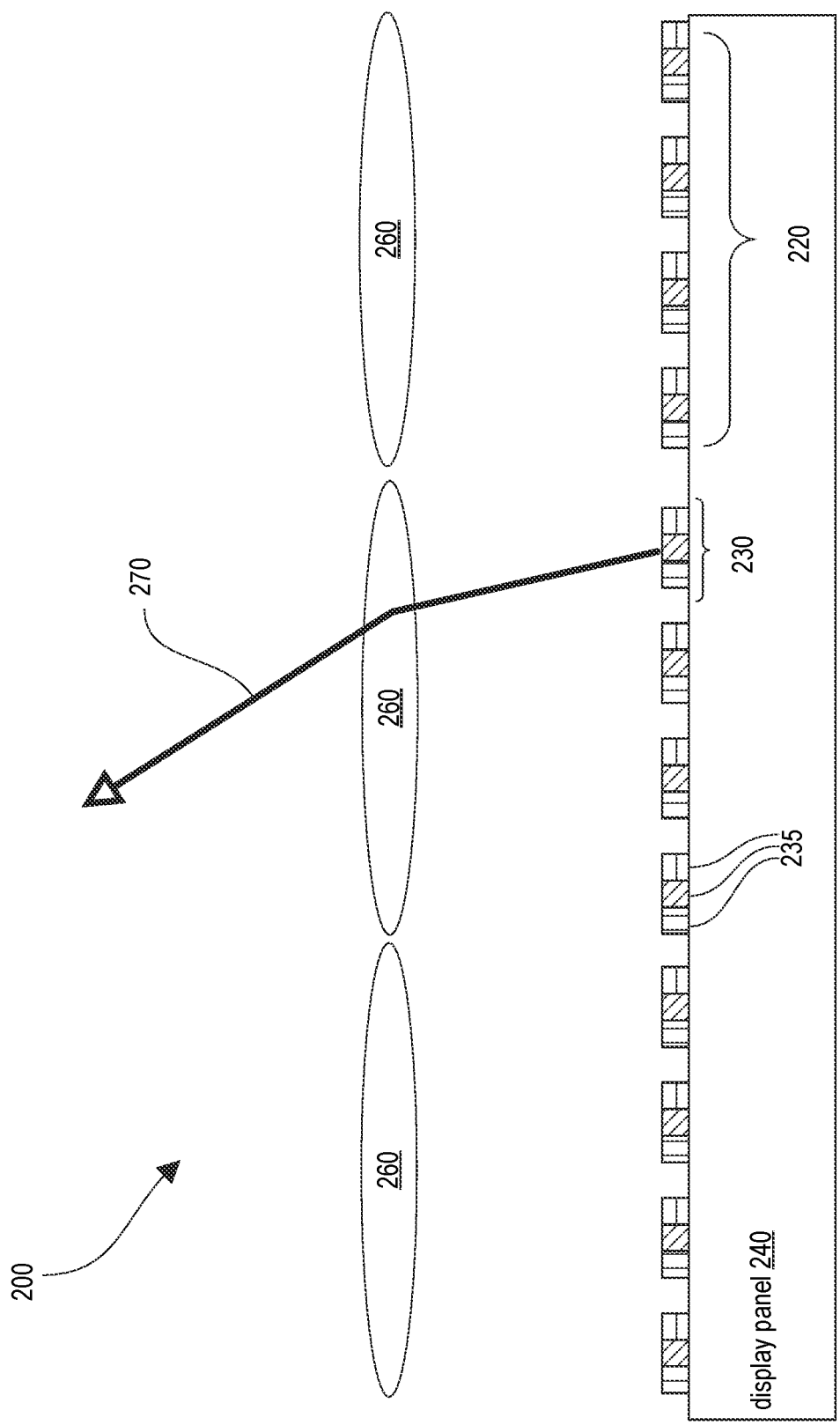
FIG. 2 is a side view of a display system having light steering optical elements, in accordance with some embodiments.

Referring to FIG. 2, a side-view of a display system 200 is shown. The display system 200 comprises light emitting elements 235, such as red, green, and/or blue micro-LED emitters, that are grouped into sub-raxels 230 as discussed above; sub-raxels are arranged into raxels 220. A light steering optical element 260, such as a lens or a micro lens, may be associated with one or more of the raxels 220. The assembly comprising the light steering optical element 260 paired with a raxel 220 may be referred to herein as a "picture element" or a "super-raxel." Light 270 from one or more light emitting elements 235 within the raxel 220 may interact with the light steering optical element 260 such that the trajectory or focus of the light 270 is altered in a predictable way based on the coordinate location (e.g., x-, y-position) of the light emitting element within the super-raxel with respect to particular contours of the light steering optical element 260.

Light emitting elements 235 are driven by a control module (not shown) to turn on or off via electrical connections between the light emitting elements 235 and the display panel 240, which may also be referred to as a backplane. Alignment between light emitting elements 235 and electrical connections on the display panel 240 must be precise in order to produce a high-quality image and a satisfactory viewing experience for users. Traditional processes by which LEDs are transferred to backplanes are generally time consuming, costly, and/or complex. Moreover, traditional LED transfer processes include multiple overlapping transfer steps for mounting LEDs of different colors onto the backplane in a given region and may not accommodate the small size and high density of micro-LEDs.

Methods, and associated challenges, of transferring LEDs from a carrier substrate or carrier tape to a display panel are illustrated in FIGS. 3-6. Referring to FIG. 3, a transfer system 300 is shown having a substrate 302 with a plurality of LEDs 304 disposed thereon. While the substrate 302 and plurality of LEDs 304 disposed thereon are shown extending in a first dimension (i.e., from left to right on the page), one of skill in the art will appreciate that the substrate and the array of LEDs 304 thereon may also extend in a second dimension (i.e., into/out of the page) that is orthogonal to the first direction.

The LEDs 304 may be made up of micro-LEDs 304*g* which are all configured to emit the same color light, such as green light in this example. One of skill in the art will appreciate that green micro-LEDs are arbitrarily selected for use in this example and that any micro-LED color, such as red or blue, can be interchanged with green for purposes of demonstrating the present concepts.

The micro-LEDs 304*g* must be aligned with and transferred to corresponding electrical connectors 306*g* on a display panel 308. In the system 300, alignment is generally achieved by providing numerous micro-LEDs 304*g* in close proximity to each other on the substrate 302. When the substrate 302 and micro-LEDs 304*g* are lowered into contact with the electrical connectors 306*g* on the display panel 308, one of the micro-LEDs 304*g* is generally near enough to each of the electrical connectors 306*g* to adhere to the electrical connector 306*g* and/or a flowable metal 310 disposed thereon to complete the transfer.

Challenges arise when one or more previously transferred micro-LED, for example micro-LED 304*r*, interferes with alignment and/or transfer of subsequent colors of micro-LEDs, such as micro-LEDs 304*g*, during a second or third overlapping transfer step. Physical interference between previously placed micro-LED 304*r* and micro-LED 304*g* may prevent micro-LED 304*g* from contacting the corresponding electrical connectors 306*g* and/or flowable metal 310 disposed thereon, thereby preventing pixel transfer.

To mitigate such physical interference, pick and place systems, such as system 400 shown in FIG. 4, may be implemented. Instead of blanketing a substrate with a plurality of micro-LEDs of a single color, as discussed with respect to system 300, system 400 relies on a pick and place handle 402 to carry, align, and transfer micro-LEDs 304*g* onto the display panel 308. The handle 402 includes protrusions 412 at selected intervals 414 such that the distance between protrusions corresponds to the distance between electrical connectors 306 of a single color. The height of protrusions 412 (e.g., the distance the protrusions extend out from the handle 402) may be selected based on the height of the micro-LEDs to be transferred. In some embodiments, the height of protrusions 412 may be greater than or equal to the height of the tallest micro-LED that will be placed on the display panel 308. Such protrusions 412 alleviate physical contact between previously transferred micro-LEDs 304*r* and to-be-transferred micro-LEDs 304*g*.

One difficulty with the pick and place system 400 is that a high degree of alignment accuracy is required between the protrusions 412, micro-LEDs 304*g*, and electrical connectors 306*g*. High accuracy alignment is generally time-consuming and may require complex equipment. If the micro-LEDs 304*g* are not centered on the protrusions 412 of handle 402 and/or if the handle 402 is not aligned precisely with the corresponding electrical connectors 306*g*, the micro-LEDs 304*g* may be transferred at a position slightly translated from the center of the electrical connector 306*g* and/or may be angled with respect to the display panel 308. Such alignment problems may decrease output image quality of the display system.

Figure 5:
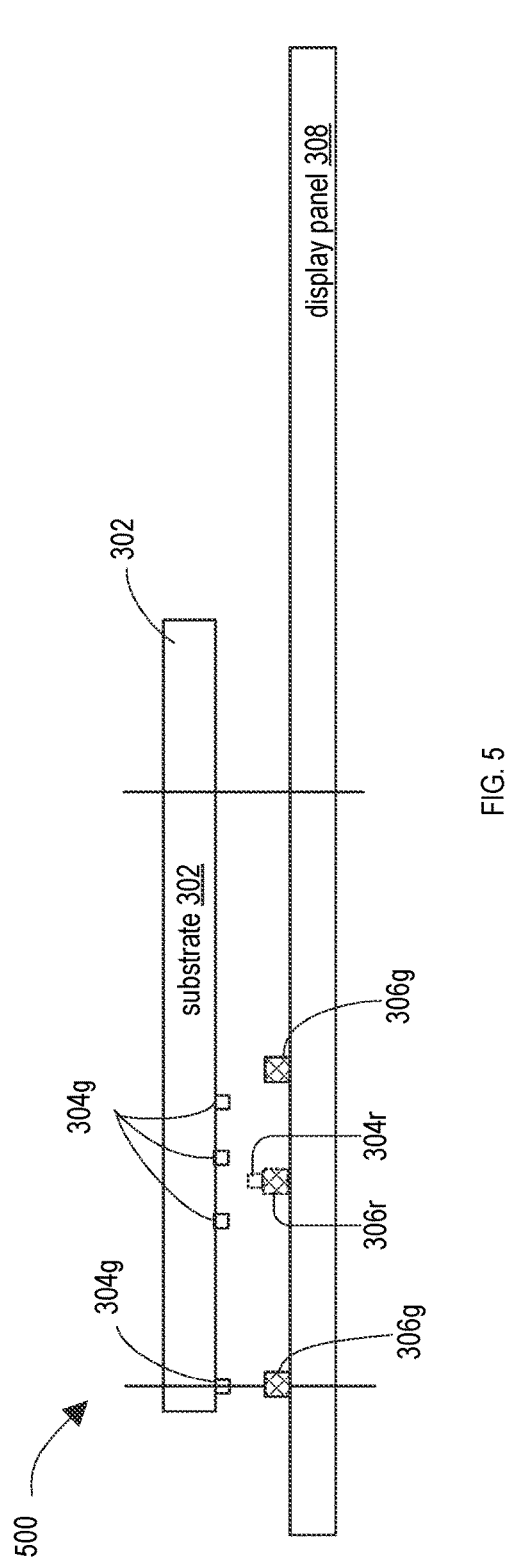
FIG. 5 illustrates a side view of an interference mitigating LED transfer system, in accordance with some embodiments.

FIG. 5 shows a pixel transfer system 500 similar to that discussed with respect to FIG. 4. Instead of providing a pick and place handle with protrusions to extend over previously transferred pixels, the system 500 works by leaving a space between micro-LEDs 304*g* on substrate 302 in areas where previously placed micro-LEDs 304*r* are expected to align during the transfer process. Thus, the to-be-transferred micro-LEDs 304*g* may contact the corresponding electrical connectors 306*g* without physical interference. Alignment issues and transfer process complexity as discussed with respect to FIGS. 3 and 4 may still occur in the system 500.

Figure 6:
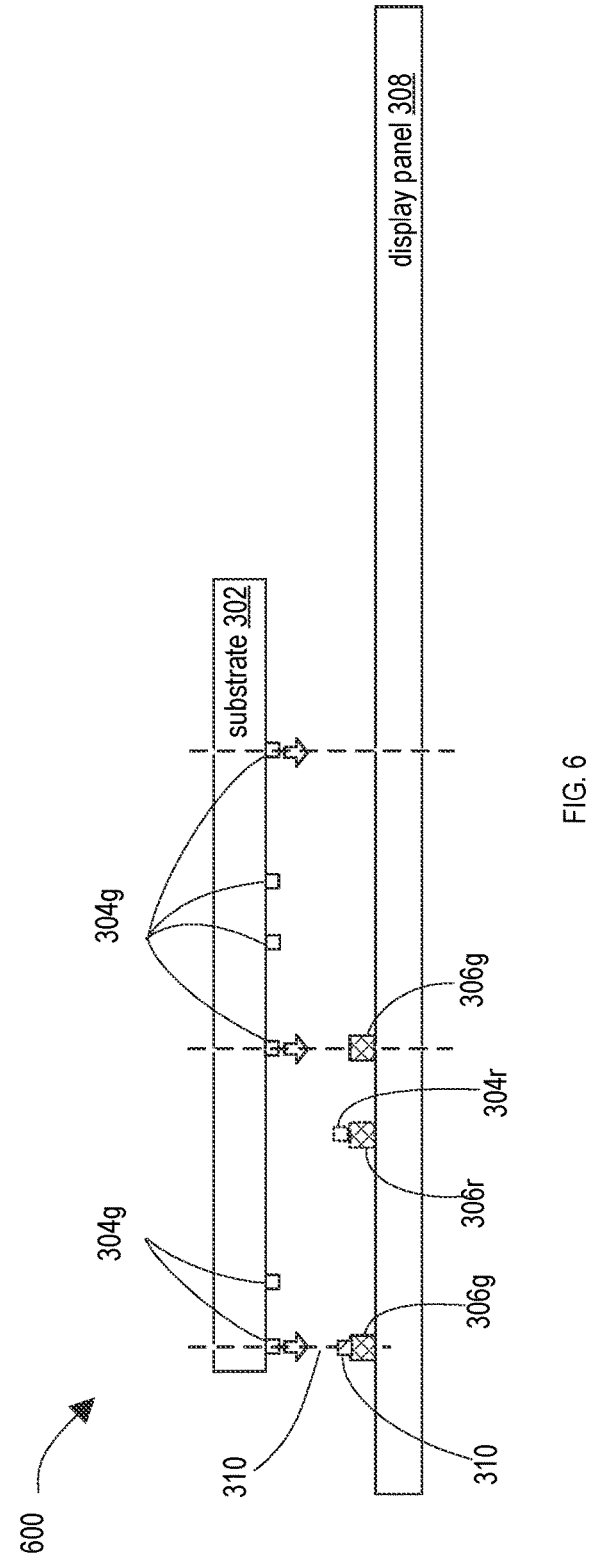
FIG. 6 illustrates a side view of a selective laser ejection LED transfer system, in accordance with some embodiments.

FIG. 6 illustrates another pixel transfer system 600 configured to mitigate physical interference between previously transferred micro-LEDs 304*r* and to-be-transferred micro- LEDs 304g. The system 600 relies on selective laser ejection and/or gravity fall in vacuum to release micro-LEDs 304g from substrate 302 while a gap exists between the micro-LEDs 304g and their corresponding electrical connectors 306g. The substrate 302 is positioned such that a gap having a height greater than or equal to the height of previously transferred micro-LEDs 304r exists between the micro-LEDs 304g and their corresponding electrical connectors 306g. Electrostatic transfer force is imparted to micro-LEDs 304g that are aligned with electrical connectors 306g and one or more of the micro-LEDs 304g fall away from the substrate 302 and land on corresponding electrical connectors 306g where they adhere via a flowable metal 310. Such a transfer method may be inaccurate as positional changes of the micro-LED can occur while falling.

Figure 7:
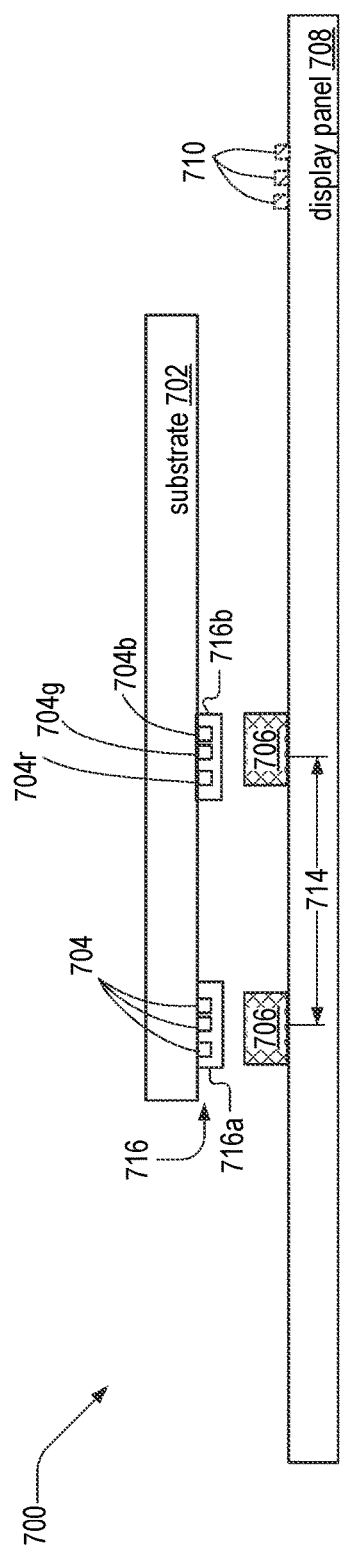
FIGS. 7 and 8 illustrates a side view of a sub-raxel transfer system, in accordance with some embodiments.
Figure 8:
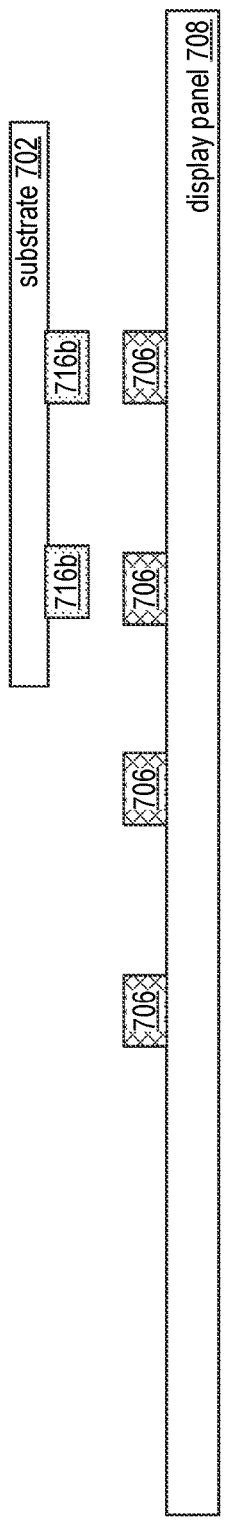

FIG. 7 shows a one step, non-overlapping, direct-contact approach to transferring micro-LED clusters of multiple colors to a display panel. The transfer system 700 comprises a substrate 702, which may be a native wafer or carrier tape, on which several clusters of micro-LEDs, such as micro-LED sub-raxels 716, are disposed. In some embodiments, the substrate, 702, may comprise an intermediate handle or panel. The clusters of micro-LEDs would then be transferred from the intermediate handle or panel onto the display. If the substrate 702 is a native wafer, each of the sub-raxels 716 may be partially released. Each sub-raxel 716 may comprise two or more micro-LEDs 704. In the example shown, each sub-raxel 716 comprises at least one red, green, and blue micro-LED 704r, 704g, and 704b, respectively. One of skill in the art will appreciate that other combinations of colors and/or other numbers of micro-LEDs, such as 2, 4, 5, 6, 9 or more, may be included within the micro-LED sub-raxel 716 without departing from the scope of the present disclosure.

Intervals 714 between non-adjacent sub-raxels 716, for example sub-raxels 716a and 716b, may correspond to a distance between electrical connectors 706 on the display panel 708. It will be appreciated that sub-raxels attached to the substrate 702 within the interval 714 could be removed; however, including additional the sub-raxels and packing the substrate 702 more densely may facilitate faster micro-LED transfer as less movement of the substrate 702 may be required between subsequent transfer contact steps. The electrical connectors 706 may include multiple separate flowable metal regions 710, each configured to contact a single micro-LED 704.

Figure 9:
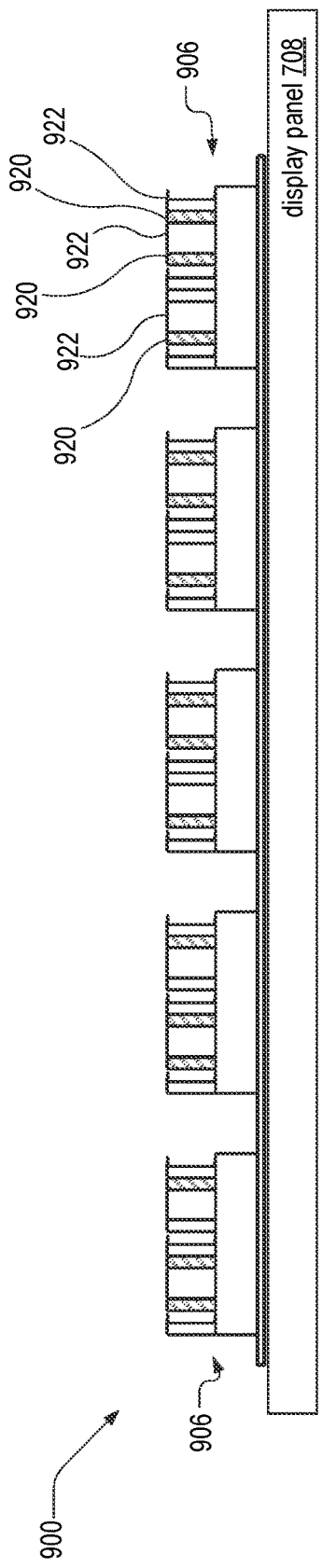
FIG. 9 shows a cross-section view of a display panel having electrical connections disposed thereon, in accordance with some embodiments.

Referring to FIG. 9, a detailed view a display panel system 900 having electrical connectors 906 thereon is shown. Connector 906 is an example of connector 906. Each electrical connector 906 on the display panel 708 may include a plurality of metal regions 920 that are insulated from each other by an electrically insulating material 922. Once contact between the clusters of micro-LEDs (e.g. sub-raxels) 716 and electrical connectors 906 is made, the two components may be bonded together using thermal, pressure, and/or sonic bonding. The bonding may be assisted by laser and/or other energy sources.

Once the clusters of micro-LEDs (e.g. sub-raxels) are bonded to electrical connectors, the cluster 716 may be fully released from the substrate 702. In some embodiments, release may be assisted by laser, elastomer, sonic, or other energy sources. The substrate 702 is then lifted away from the display panel 708 and is translated to a new position over the display panel 708 as shown in FIG. 8. The new position is substantially non-overlapping with the first position shown in FIG. 7. The substrate 702 is lowered toward the display panel 708 in the new position so that additional clusters 716 still coupled with the substrate 702 are transferred onto corresponding electrical connectors 706. Notably, because transfer of all micro-LEDs for a given substrate region or position occurs in one step instead of requiring multiple overlapping transfer steps for each color micro-LED, there is no physical interference between previously transferred and to-be-transferred micro-LEDs. Thus, packaging multiple micro-LEDs together prior to transferring the micro-LEDs to a display panel eliminates the need for multiple transfer steps on the same region of the display panel and eliminates the physical interference described above. Reducing the number of transfer steps and eliminating physical interference allows simple, fast, and cost-effective processes, such as those described with respect to FIGS. 7 and 8, to be used to create high quality, well-aligned micro-LED displays.

This description has used the transfer of microLED clusters 716, where the clusters are formed into sub-raxels as an example. Those having skill in the art will understand that the same transfer concepts may be applied to the transfer of clusters 716, formed into raxels from a substrate to the display where a raxel is understood to comprise a plurality of sub-raxels as described previously. Those having skill in the art will understand that the same transfer concepts may be applied to the transfer of clusters 716, formed into chiplets from a substrate to the display where a chiplet is understood to comprise a plurality of raxels electrically connected to a microIC as described previously.

Figure 10:
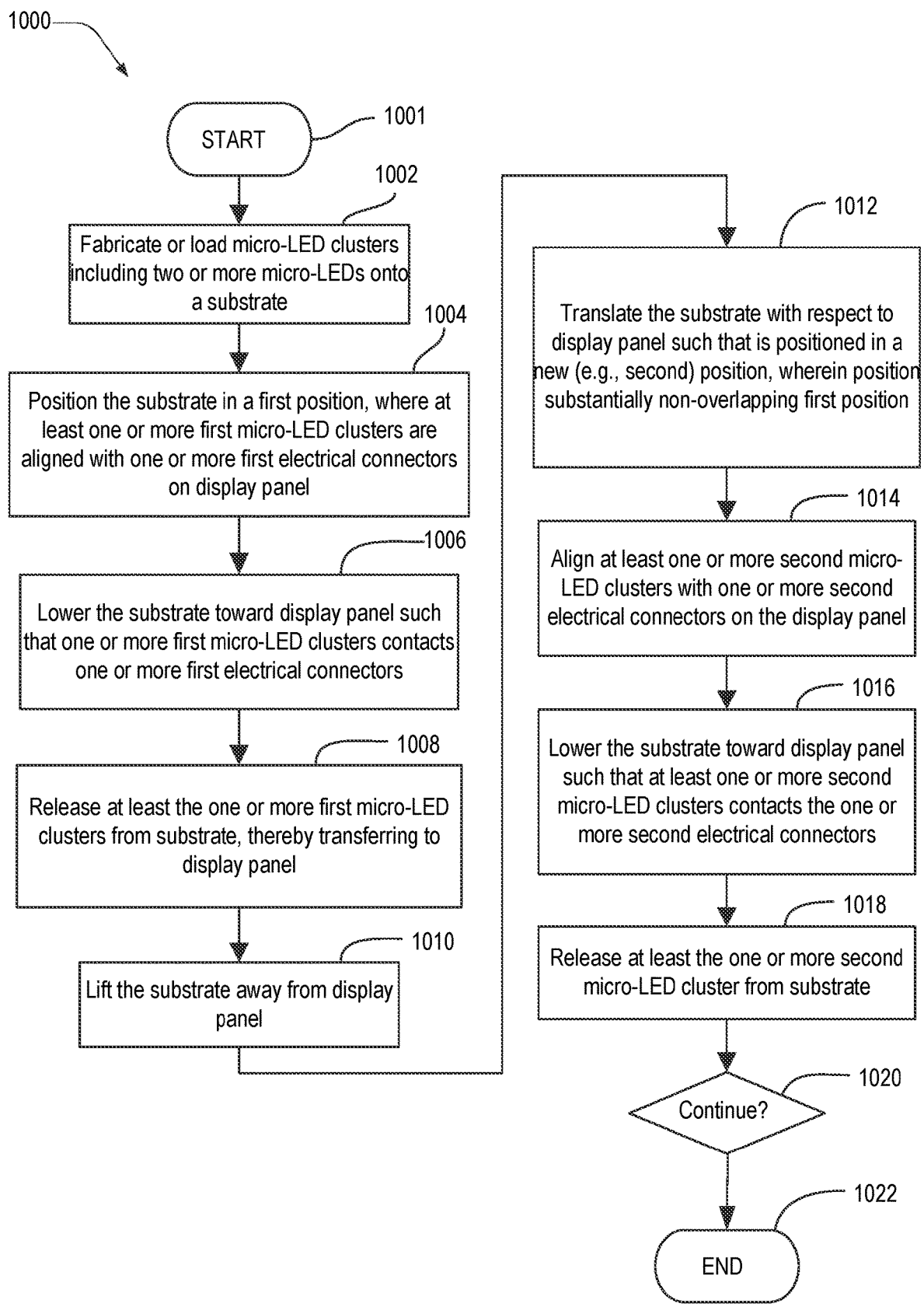
FIG. 10 is a process flow diagram describing steps for transferring a sub-raxel to a display panel, in accordance with some embodiments disclosed herein.

FIG. 10 is a process flow diagram for a method 1000 of transferring micro-LEDs from a substrate to a display panel. Method 1000 begins with a start step 1001 then proceeds to step 1002, which may comprise fabricating or loading a plurality of micro-LED clusters, each micro-LED cluster comprising two or more micro-LEDs, onto a carrier substrate. Step 1004 comprises positioning the substrate in a first position, wherein at least one or more first micro-LED clusters are aligned with at least one or more first electrical connectors on a display panel. The substrate is then lowered toward the display panel such that at least the one or more first micro-LED cluster contact at least the one or more first electrical connectors at step 1006. Step 1008 comprises releasing at least the one or more first micro-LED clusters from the substrate, thereby transferring at least the one or more first micro-LED clusters to the display panel. At this step, the transfer of micro-LED clusters is not limited to a single micro-LED cluster but may comprise the transfer of two or more micro-LED clusters. The transfer of two or more micro-LED clusters may improve the manufacturing efficiency and lower the manufacturing cost of the display. The substrate may then be lifted away from the display panel at step 1010. At step 1012, the substrate may be translated to a new position with respect to the display panel such that the new position of the substrate is substantially non-overlapping with the first position or any other previous position where a contact transfer step was completed. At step 1014, at least one or more second micro-LED clusters are aligned with at least one or more second electrical connectors on the display panel and the substrate is then lowered toward the display panel such that at least the one or more second micro-LED clusters contact at least the one or more second electrical connectors at step 1016. At least the one or more second micro-LED cluster is released from the substrate at step 1018. As discussed previously, at this step, the transfer of micro-LED clusters is not limited to a single micro-LED cluster but may comprise the transfer of two or more micro-LED clusters. The transfer of two or more micro-LED clusters may improve the manufacturing efficiency and lower the manufacturing cost of the display. At step 1020, the process may continue with lifting and translating the substrate to a new (e.g., third or more) position with respect to the display panel such that the new position is substantially non-overlapping with any previous position. The process finishes at step 1022.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention.

Combination of Features

Features described above as well as those claimed below may be combined in various ways without departing from the scope hereof. The following enumerated examples illustrate some possible, non-limiting combinations:

(A1) A method of transferring a plurality of micro-LED clusters from a substrate to a display panel includes: fabricating or loading the plurality of micro-LED clusters onto the substrate, wherein each micro-LED cluster comprises two or more micro-LEDs; positioning the substrate in a first position, wherein a first of the plurality of micro-LED clusters are aligned with a first cluster of electrical connectors disposed on the display panel; moving the substrate toward the display panel such that the first micro-LED clusters contact the first electrical connectors; and releasing the first micro-LED clusters from the substrate.

(A2) In embodiments of (A1), each of the micro-LED clusters comprises a micro-LED configured to emit a first color and a micro-LED configured to emit a second color.

(A3) In either one of embodiments (A1) or (A2), each of the micro-LED clusters further comprises a micro-LED configured to emit a third color.

(A4) Any one of embodiments (A1)-(A4) further including the method includes moving the substrate away from the display panel; translating the substrate with respect to the display panel such that the substrate is positioned in a second position, wherein the second position is non-overlapping with the first position; aligning at least a second plurality of micro-LED clusters with at least a second plurality of electrical connectors disposed on the display panel; moving the substrate toward the display panel such that the second plurality of micro-LED clusters contact the second plurality of electrical connectors; and releasing the second plurality of micro-LED clusters from the substrate.

(A5) In any one of embodiments (A1)-(A5), each of the micro-LED clusters further comprises an integrated circuit.

(B1) A micro-LED cluster comprising a plurality of micro-LEDs and an integrated circuit includes electrical interconnects electrically coupled with the plurality of micro-LEDs.

(B2) In embodiments of (B1), the integrated circuit is bonded to the plurality of micro-LEDs.

(B3) In either one of embodiments (B1) or (B2), the integrated circuit is monolithically formed with the plurality of micro-LEDs.

(B4) In any one of embodiments (B1)-(B4), the integrated circuit is coupled with an electrical circuit on a display panel.

(B5) In any one of embodiments (B1)-(B5), the integrated circuit is coupled with a passive display panel.

(B6) Any one of embodiments (B1)-(B6) further including a micro lens coupled with the plurality of micro-LEDs.

(B7) Any one of embodiments (B1)-(B7) further including a plurality of micro lenses coupled with the plurality of micro-LEDs.

Accordingly, many different embodiments stem from the above description and the drawings. It will be understood that it would be unduly repetitious and obfuscating to literally describe and illustrate every combination and subcombination of these embodiments. As such, the present specification, including the drawings, shall be construed to constitute a complete written description of all combinations and subcombinations of the embodiments described herein, and of the manner and process of making and using them, and shall support claims to any such combination or subcombination.

What is claimed is:

1. A method of transferring a plurality of micro-LED clusters from a substrate to a display panel, the method comprising:
    positioning the substrate in a first position such that a first micro-LED cluster of the plurality of micro-LED clusters is aligned with a first cluster of electrical connectors disposed on the display panel, each of the plurality of micro-LED clusters includes at least two micro-LEDs;
    moving the substrate toward the display panel such that the first micro-LED cluster of the plurality of micro-LED clusters contacts the first cluster of electrical connectors;
    releasing the first micro-LED cluster of the plurality of micro-LED clusters from the substrate;
    moving the substrate from the first position to a second position with respect to the display panel, the second position being different from the first position; and
    moving the substrate from the second position toward the display panel such that a second micro-LED cluster of the plurality of micro-LED clusters contacts a second cluster of electrical connectors.

2. The method of claim 1, wherein the first micro-LED cluster of the plurality of micro-LED clusters includes a micro-LED configured to emit a first color and a micro-LED configured to emit a second color.

3. The method of claim 2, wherein the first micro-LED cluster of the plurality of micro-LED clusters further includes a micro-LED configured to emit a third color.

4. The method of claim 1, wherein the first micro-LED cluster of the plurality of micro-LED clusters further includes an integrated circuit.

5. The method of claim 4, wherein the integrated circuit is bonded to the first micro-LED cluster of the plurality of micro-LED clusters.

6. The method of claim 4, wherein the integrated circuit is monolithically formed with the first micro-LED cluster of the plurality of micro-LED clusters.

7. The method of claim 4, wherein the integrated circuit is coupled with an electrical circuit on a display panel.

8. The method of claim 4, wherein the integrated circuit is coupled with a passive display panel.

9. The method of claim 4, further comprising a micro lens coupled with the first micro-LED cluster of the plurality of micro-LED clusters.

10. The method of claim 4, further comprising a plurality of micro lenses coupled with the first micro-LED cluster of the plurality of micro-LED clusters.

11. A method, comprising:
aligning, at a first position, a first micro-LED cluster coupled to a substrate with a first cluster of electrical connectors disposed on a display panel, the first micro-LED cluster including at least two micro-LEDs;
moving the substrate toward the display panel such that the first micro-LED cluster contacts the first cluster of electrical connectors;
releasing the first micro-LED cluster from the substrate; and
moving the substrate from the first position to a second position with respect to the display panel, the second position non-overlapping with the first position; and
moving the substrate toward the display panel such that a second micro-LED cluster contacts a second cluster of electrical connectors.

12. The method of claim 11, wherein the first micro-LED cluster includes a micro-LED configured to emit a first color and a micro-LED configured to emit a second color.

13. The method of claim 11, wherein the first micro-LED cluster further includes an integrated circuit, the integrated circuit is bonded to the first micro-LED cluster.

14. The method of claim 13, wherein the integrated circuit is monolithically formed with the first micro-LED cluster.

15. The method of claim 13, further comprising a micro lens coupled with the first micro-LED cluster.

16. A method, comprising:
positioning a substrate such that a first micro-LED cluster, coupled to the substrate, is aligned at a first position with a first cluster of electrical connectors disposed on a display panel, the first micro-LED cluster including at least two micro-LEDs;
moving the substrate toward the display panel such that the first micro-LED cluster contacts the first cluster of electrical connectors;
releasing the first micro-LED cluster from the substrate; and
moving the substrate from the first position to a second position with respect to the display panel; and
moving the substrate toward the display panel such that a second micro-LED cluster contacts a second cluster of electrical connectors.

17. The method of claim 16, wherein the first micro-LED cluster is included in a plurality of micro-LED clusters, the first cluster of electrical connectors is included in a plurality of clusters of electrical connectors,
the positioning includes positioning the plurality of micro-LED clusters with the plurality of clusters of electrical connectors disposed on the display panel,
the moving includes moving the substrate toward the display panel such that the plurality of micro-LED clusters contact the plurality of clusters of electrical connectors,
the releasing includes releasing the plurality of micro-LED clusters from the substrate.

* * * * *